(12) United States Patent
Li et al.

(10) Patent No.: US 9,337,120 B2
(45) Date of Patent: May 10, 2016

(54) MULTI-CHIP MODULE WITH MULTIPLE INTERPOSERS

(75) Inventors: Li Li, San Ramon, CA (US); Subbarao Arumilli, Cupertino, CA (US); Lin Shen, Saratoga, CA (US)

(73) Assignee: Cisco Technology, Inc., San Jose, CA (US)

(*) Notice: Subject to any disclaimer, the term of this patent is extended or adjusted under 35 U.S.C. 154(b) by 525 days.

(21) Appl. No.: 13/588,544

(22) Filed: Aug. 17, 2012

(65) Prior Publication Data
US 2014/0048928 A1 Feb. 20, 2014

(51) Int. Cl.
| | |
|---|---|
| H01L 23/28 | (2006.01) |
| H01L 23/36 | (2006.01) |
| H01L 23/498 | (2006.01) |
| H01L 23/538 | (2006.01) |
| H01L 25/065 | (2006.01) |
| H01L 23/00 | (2006.01) |

(52) U.S. Cl.
CPC .......... *H01L 23/36* (2013.01); *H01L 23/49811* (2013.01); *H01L 23/5385* (2013.01); *H01L 24/14* (2013.01); *H01L 25/0652* (2013.01); *H01L 25/0655* (2013.01); *H01L 24/13* (2013.01); *H01L 24/16* (2013.01); *H01L 25/0657* (2013.01); *H01L 2224/131* (2013.01); *H01L 2224/13082* (2013.01); *H01L 2224/13147* (2013.01); *H01L 2224/1403* (2013.01); *H01L 2224/14051* (2013.01); *H01L 2224/16146* (2013.01); *H01L 2224/16225* (2013.01); *H01L 2224/16227* (2013.01); *H01L 2224/16238* (2013.01); *H01L 2224/73253* (2013.01); *H01L 2225/06513* (2013.01); *H01L 2225/06541* (2013.01); *H01L 2225/06565* (2013.01); *H01L 2924/00014* (2013.01); *H01L 2924/15192* (2013.01); *H01L 2924/15311* (2013.01)

(58) Field of Classification Search
CPC ....................................................... H01L 25/00
See application file for complete search history.

(56) References Cited

U.S. PATENT DOCUMENTS

| | | | |
|---|---|---|---|
| 2010/0244222 A1* | 9/2010 | Chi et al. ....................... | 257/690 |
| 2012/0106117 A1* | 5/2012 | Sundaram et al. ............. | 361/808 |
| 2013/0193587 A1* | 8/2013 | Chen et al. ..................... | 257/777 |
| 2013/0200511 A1* | 8/2013 | Banijamali .................... | 257/737 |

OTHER PUBLICATIONS

Banijamali, et al., "Advanced Reliability Study of TSV Interposers and Interconnects for the 28nm Technology FPGA," IEEE, 2011 Electronics Components and Technology Conference, pp. 285-290, 2011.

* cited by examiner

*Primary Examiner* — Mohammad Choudhry
(74) *Attorney, Agent, or Firm* — Edell, Shapiro & Finnan, LLC (57) ABSTRACT

A Multi-Chip Module is presented herein that comprises a package substrate, at least two integrated circuit devices, each of which is electrically coupled to the package substrate, and an interposer. Formed in the interposer are electrical connections which are predominantly horizontal interconnects. The first interposer is arranged to electrically couple the two integrated circuit devices to each other. Methods for manufacturing a Multi-Chip Module are also presented herein.

24 Claims, 12 Drawing Sheets

MULTI-CHIP MODULE WITH MULTIPLE INTERPOSERS

TECHNICAL FIELD

The present disclosure relates to connections between integrated circuit devices.

BACKGROUND

Recently, Multi-Chip Modules (MCMs) utilizing silicon interposer and Through-Silicon-Via (TSV) technologies have been used to integrate multiple integrated circuit (IC) devices on a silicon substrate using flip-chip interconnect techniques. This type of IC integration is often referred to as the 2.5 Dimensional (2.5D) IC integration. Compared to the organic, build-up substrate used in the conventional flip-chip package, the silicon interposer can provide much higher wiring densities due to silicon wafer fabrication processes employed in manufacturing silicon interposers.

However, as a result of the reticle size used in the lithographic processes used to fabricate the interposers, the size of silicon interposers from the leading foundries is currently limited to 26 mm×32 mm (or even smaller). This size limitation is a drawback for using a silicon interposer because the die sizes for high performance ASICs are usually large and often leave no room on the silicon interposer to place memory devices or other large size ASIC devices.

DESCRIPTION OF EXAMPLE EMBODIMENTS

Overview

A Multi-Chip Module is presented herein that comprises a package substrate, at least two integrated circuit devices, each of which is electrically coupled to the package substrate, and an interposer. Formed in the interposer are electrical connections which are predominantly horizontal interconnects. The first interposer is arranged to electrically couple the two integrated circuit devices to each other. Methods for manufacturing a Multi-Chip Module are also presented herein.

Example Embodiments

Figure 1A:
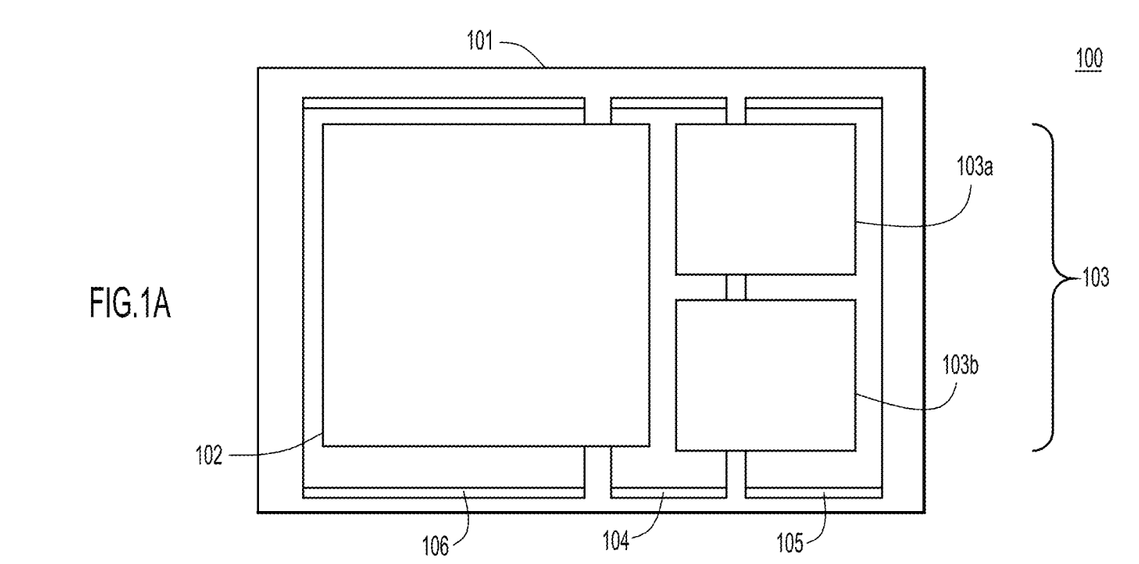
FIG. 1A is a top view of an example Multi-Chip Module (MCM) using multiple interposers to form electrical connections between the components of the module.
Figure 1B:
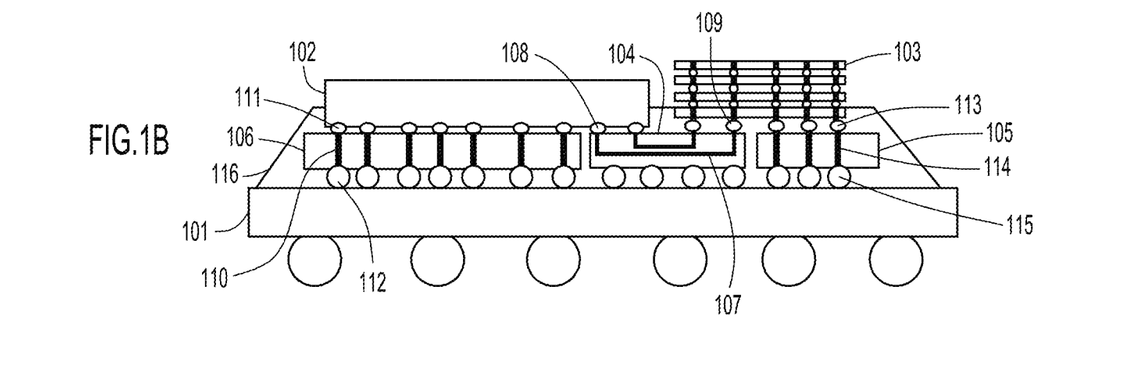
FIG. 1B is a side view of the MCM of FIG. 1A.

Referring first to FIGS. 1A and 1B, a Multi-Chip Module (MCM) 100 is shown. The MCM 100 includes a package substrate 101 that is electrically coupled to multiple (e.g., three) integrated circuit (IC) devices, e.g., an application specific integrated circuit (ASIC) 102 and memory stacks 103a and 103b. MCM 100 includes two memory stacks 103a and 103b, generically referred to by reference numeral 103, though more or fewer memory stacks may be deployed in the MCM 100. Three interposers are provided in order to electrically couple (connect) package substrate 101, ASIC 102, and the memory stacks 103. Specifically, interposers 104, 105 and 106 are arranged between the package substrate 101 and the IC devices, i.e., the ASIC 102 and memory stacks 103. Electrical connections 107, 110 and 114 are formed in interposers 104, 105 and 106. More specifically, electrical connections 107 comprise horizontal interconnects, while electrical connections 110 and 114 comprise through-silicon vias.

Interposer 104 electrically couples ASIC 102 to each of memory stacks 103a and 103b by the horizontal interconnects 107 formed therein. Specifically, microbumps 108 located on a package substrate-facing side of the ASIC 102 are electrically connected to horizontal interconnects 107. The horizontal interconnects 107 are, in turn, electrically coupled to microbumps 109 located on a package substrate-facing side of memory stacks 103. As depicted, the horizontal interconnects 107 are predominantly oriented in the horizontal direction, with small portions oriented in the vertical direction in order to connect to microbumps 108 and 109. Accordingly, as used herein, a "horizontal interconnect" refers to an interconnect structure which forms an electrical connection between integrated circuit devices (such as ASIC 102 and memory stacks 103) without connecting first to the package substrate 101, even if the orientation of the horizontal interconnect is not solely in the horizontal direction.

In order to electrically connect ASIC 102 to the package substrate 101, vertical through vias 110 are formed in interposer 106. Microbumps 111 are formed on a package substrate-facing side of ASIC 102 and are electrically coupled to vertical through vias 110. Vertical through vias 110 are, in turn, electrically coupled to solder bumps 112 which are formed on a package substrate-facing side of interposer 106. Solder bumps 112 are, in turn, electrically coupled to package substrate 101. Similarly, memory stacks 103 are electrically coupled to package substrate 101 through microbumps 113, vertical through vias 114 formed in interposer 105, and solder bumps 115. As used herein, a "vertical through via" refers to an electrical connection or coupling between an integrated circuit device (such as ASIC 102 or memory stack 103) and the package substrate 101 made through an interposer without connecting through another integrated circuit device, even if the orientation of the via is not solely in the vertical direction.

Underfill 116 may be provided to protect the various electrical connections of the integrated circuit devices 102 and 103 and the package substrate 101.

As depicted in FIG. 1B, multiple interposers, e.g., interposers 104, 105 and 106, are used to form the electrical connections between ASIC 102, memory stacks 103, and package substrate 101. Specifically, the electrical connections are arranged such that each interposer contains predominantly one type of connection. For example, interposer 104 contains only horizontal interconnects 107, while interposers 105 and 106 contain only vertical through vias 114.

By using multiple smaller interposers instead of one larger interposer, it is possible to achieve the high wiring densities provided by interposers for sizes in excess of the manufacturing limitations for single interposers. Specifically, as die size increases, the size of the interposer needed to accommodate the die also increases. Yet, interposer size is limited by, for example, reticle size of the lithographic systems used to manufacture interposers. Accordingly, the size of a die may outstrip the ability to make an interposer large enough to accommodate all of the necessary electrical connections. Nevertheless, through the use of a modular system of interposers, all of the electrical connections between a die and a package substrate can be accommodated. For example, while no single interposer is large enough to accommodate all of the electrical connections for ASIC 102, memory stack 103a and memory stack 103b, the combination of the three interposers is able to accommodate all of the required electrical connections.

When the size of the integrated circuit devices is greater than the area of the interposer, an area of overlap between one of the integrated circuit devices and the interposer is less than the entire area of the integrated circuit device. For example, in FIG. 1A, the area of overlap between interposer 104 and ASIC 102 is less than the entire area of ASIC 102. Similarly, the area of overlap between memory stack 103a and interposer 104 is less than the total area for memory stack 103a.

Furthermore, because of the small size of each of the interposers, the manufacturing yields achieved for the multiple interposers may be higher than the yield for a single larger interposer. Finally, because each interposer can be manufactured with predominantly only horizontal interconnects or vertical through vias, the manufacturing yield for the interposers can be further improved over a single interposer containing different types of electrical connections.

Figure 2A:
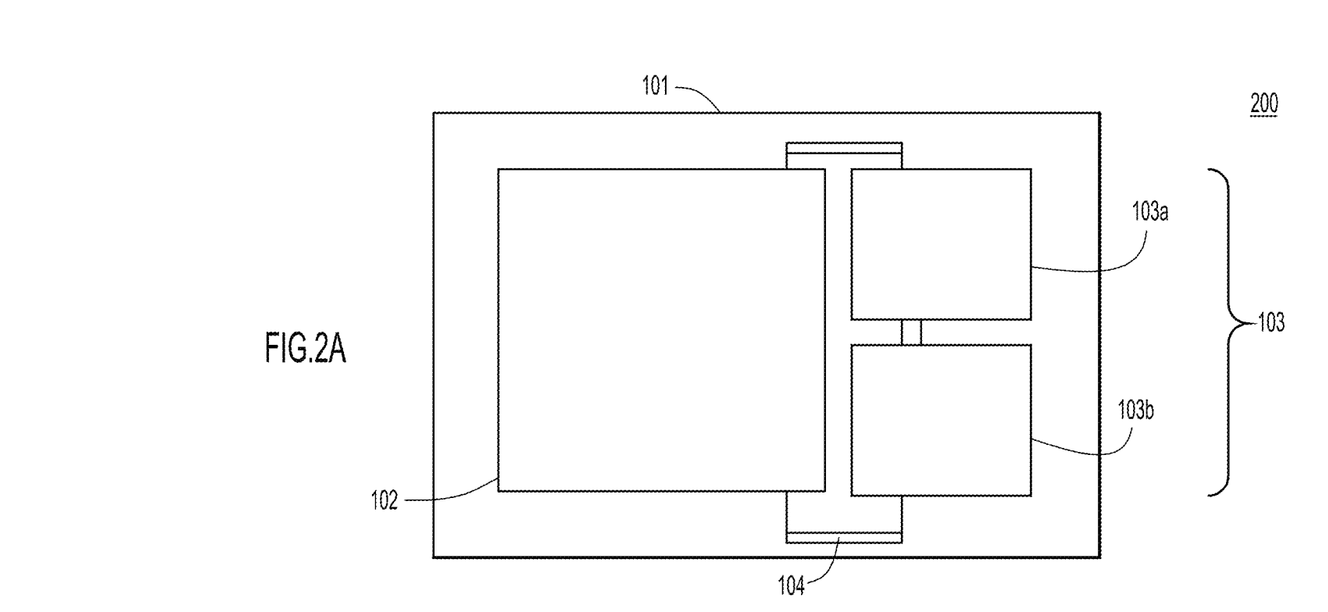
FIG. 2A is a top view of an example MCM using multiple interposers and copper pillars to form electrical connections between the components of the module.
Figure 2B:
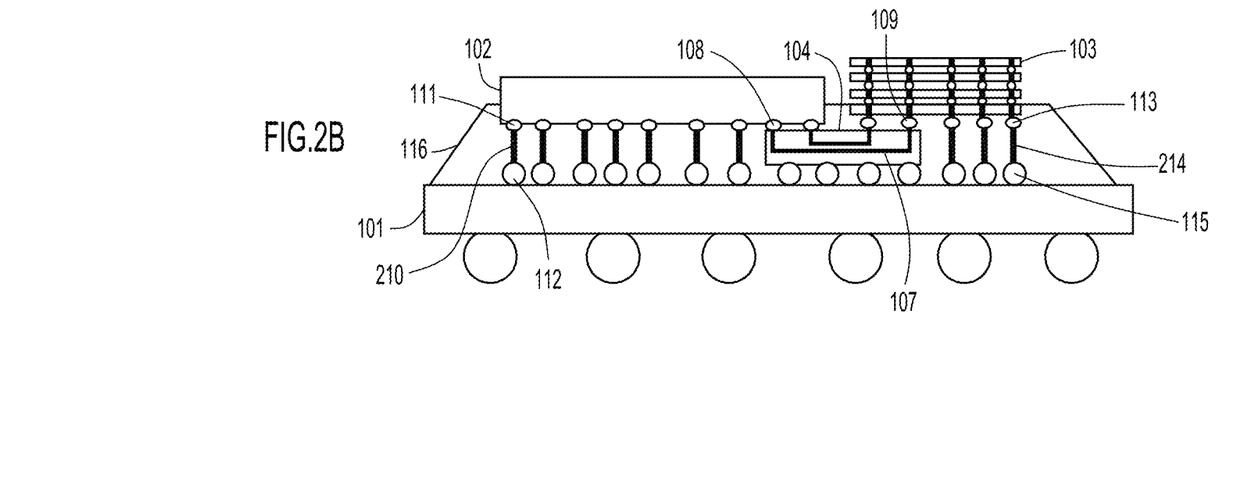
FIG. 2B is a side view of the MCM of FIG. 2A

Turning to FIGS. 2A and 2B, depicted therein is another MCM 200. To the extent that MCM 200 is similar to MCM 100 depicted in FIGS. 1A and 1B, like reference numerals are used to refer to like components.

MCM 200 lacks interposers to electrically couple the integrated circuit devices to package substrate 101. Instead, the connections between ASIC 102 and package substrate 101 comprise microbumps 111 formed on a package substrate-facing side of ASIC 102, connected through copper pillars 210 to solder bumps 112 formed on an ASIC-facing side of package substrate 101. The electrical connections between memory stacks 103 and package substrate 101 are similarly formed through microbumps 113 formed on a package substrate-facing side of memory stacks 103, through, copper pillars 214 and solder bumps 115 formed on a memory stack-facing side of package substrate 101. Interposer 104 is used in MCM 200 in order to form the horizontal connections between ASIC 102 and memory stacks 103.

Figure 3A:
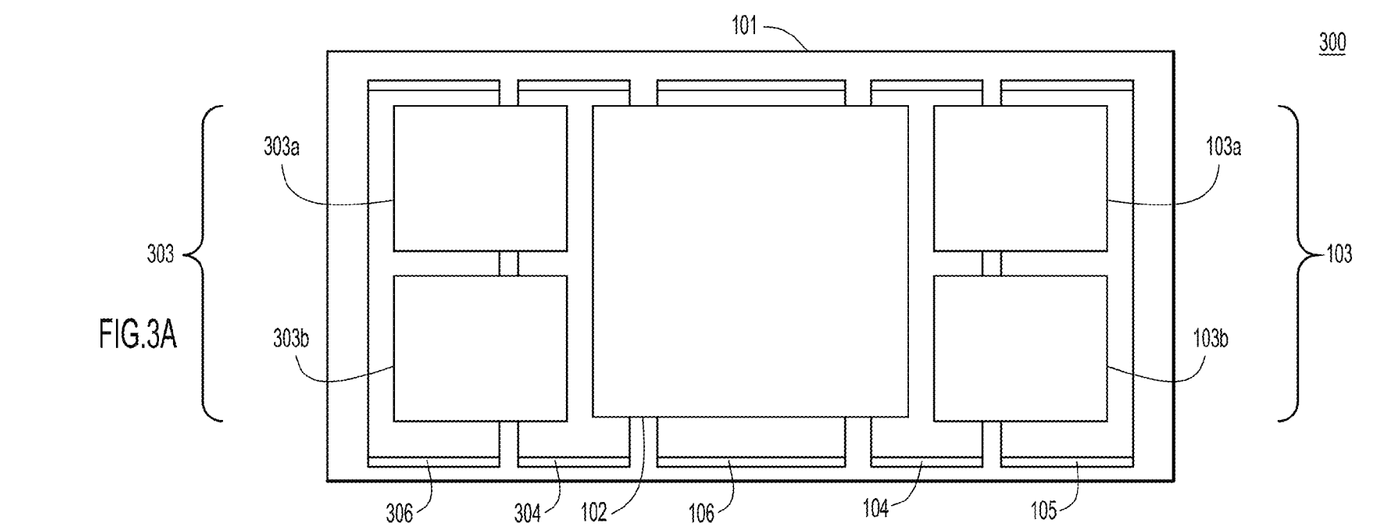
FIG. 3A is a top view of another example MCM using multiple interposers to form electrical connections between the components of the module.
Figure 3B:
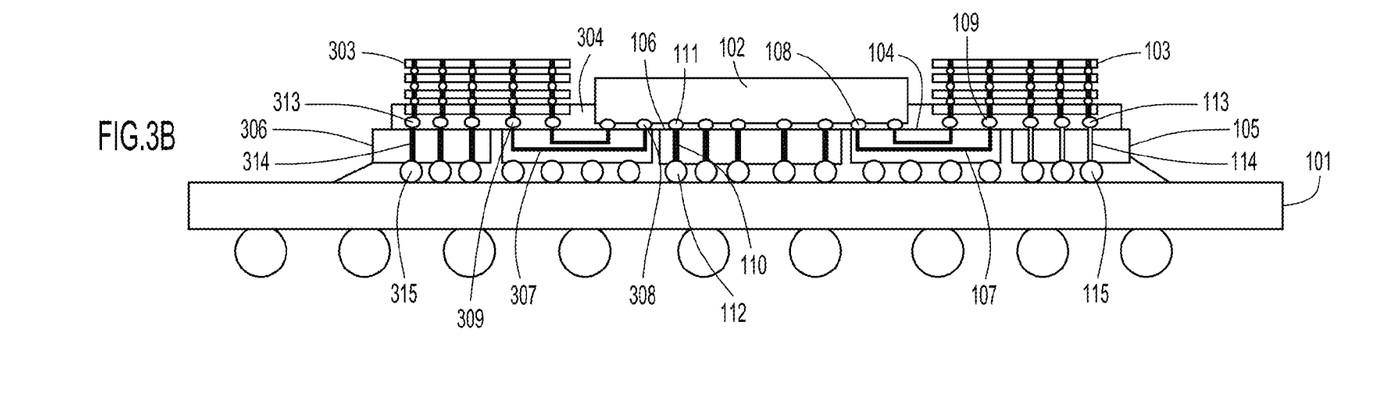
FIG. 3B is a side view of the MCM of FIG. 3A.

With reference to FIGS. 3A and 3B, yet another MCM 300 is shown. MCM 300 is similar to MCM 100 depicted in FIGS. 1A and 1B, but includes two additional memory stacks 303a and 303b, generically referred to with reference numeral 303. Interposers 304 and 306 are provided to make the electrical connections between ASIC 102, memory stacks 303 and package substrate 101.

Interposer 304 electrically connects ASIC 102 to each of memory stacks 303a and 303b through horizontal interconnects 307 formed therein. Specifically, microbumps 308 located on a package substrate-facing side of the ASIC 102 are electrically connected to horizontal interconnects 307. The horizontal interconnects 307 are, in turn, electrically connected to microbumps 309 located on a package substrate-facing side of memory stacks 303. Memory stacks 303 electrically connect to package substrate 101 through microbumps 313, vertical through vias 314 formed in interposer 305, and solder bumps 315.

Figure 4A:
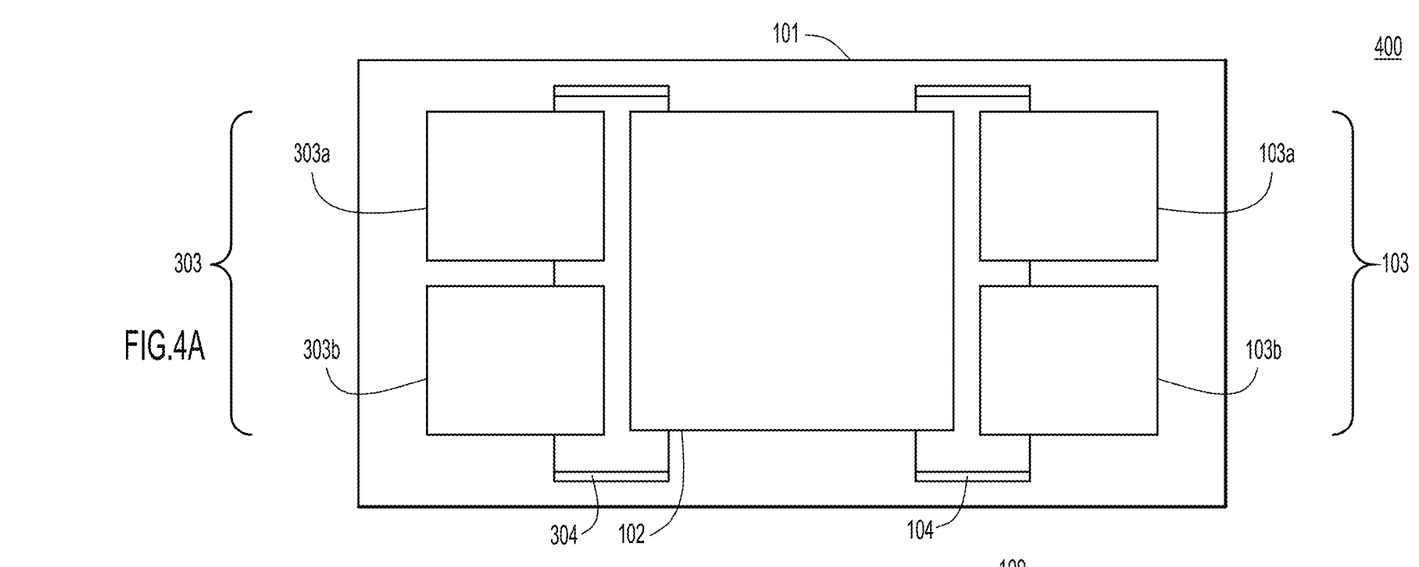
FIG. 4A is a top view of another example MCM using multiple interposers and copper pillars to form electrical connections between the components of the module.
Figure 4B:
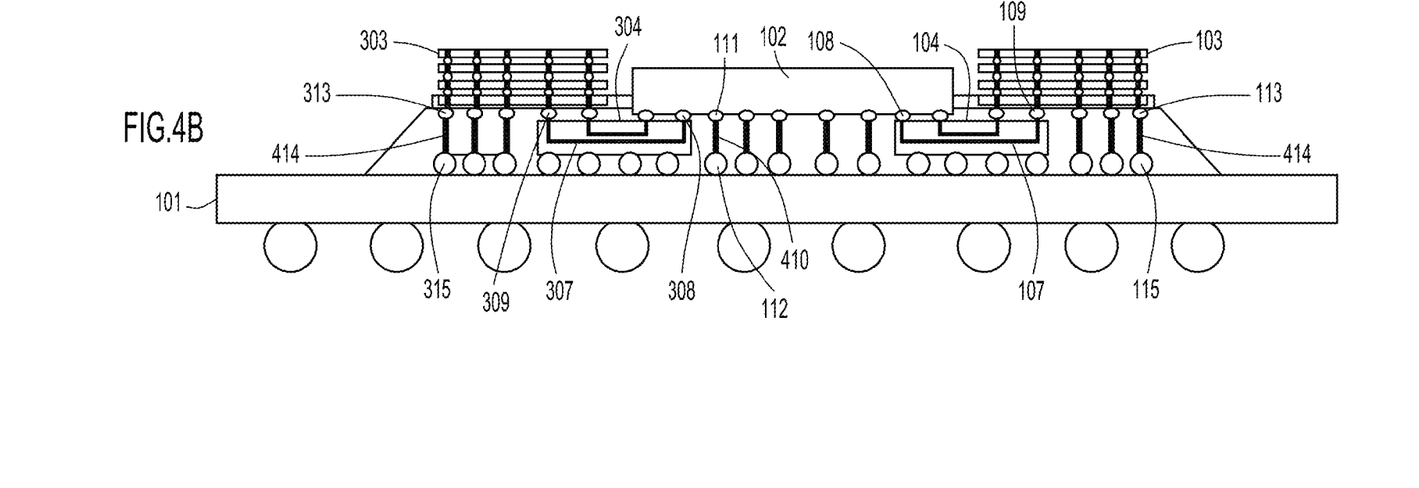
FIG. 4B is a side view of the MCM of FIG. 4A.

Turning now to FIGS. 4A and 4B, still another MCM 400 is described. MCM 400 lacks interposers 105, 106, 305 and 306. Instead, the connections between ASIC 102 and package substrate 101 comprise microbumps 111 formed on a package substrate-facing side of ASIC 102, connected through copper pillars 410 to solder bumps 112 formed on an ASIC-facing side of package substrate 101. The electrical connections between memory stacks 103 and package substrate 101 are similarly formed through microbumps 113 formed on a package substrate-facing side of memory stacks 103, through, copper pillars 414 and solder bumps 115 formed on a memory stack-facing side of package substrate 101. The electrical connections between memory stacks 303 and package substrate 101 are similarly formed through microbumps 313 formed on a package substrate-facing side of memory stack 103, through, copper pillars 415 and solder bumps 315 formed on a memory stack-facing side of package substrate 101.

Horizontal interconnects 107 in interposer 104 form the horizontal connections between ASIC 102 and memory stacks 103. Similar to the example in FIGS. 3A and 3B, horizontal interconnects 307 in interposer 304 form the horizontal connections between ASIC 102 and memory stacks 303.

Figure 5:
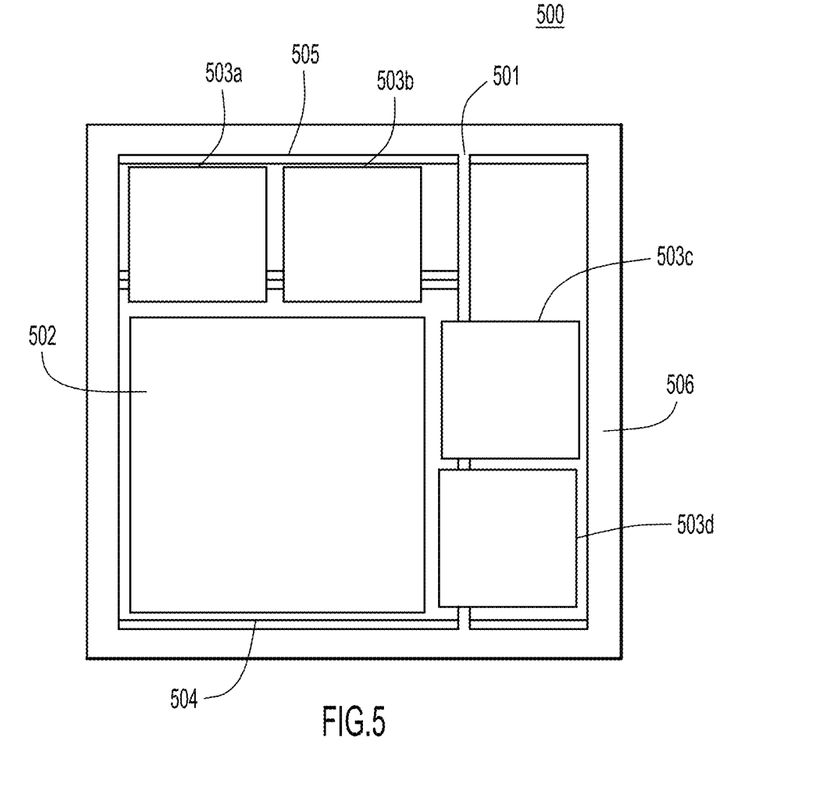
FIG. 5 is a top view of yet another example MCM using multiple interposers to form electrical connections between the components of the module.

Reference is now made to FIG. 5. FIG. 5 shows MCM 500, which comprises package substrate 501, ASIC 502, memory stacks 503a, 503b, 503c and 503d, and interposers 504, 505 and 506. In MCM 500, interposer 504 is large enough to accommodate all of the electrical connections from ASIC 502 to package substrate 501 and the electrical connections from ASIC 502 to memory stacks 503a-503d. Accordingly, interposer 504 includes both horizontal interconnects and vertical through vias electrically coupling ASIC 502 to package substrate 501 and memory stacks 503a-d. On the other hand, interposer 504 is not large enough to accommodate the electrical connections between memory stacks 503a-503d and package substrate 501. Accordingly, interposer 505 is provided to electrically connect memory stacks 503a and 503b to package substrate 501, and interposer 506 is provided to electrically connect memory stacks 503c and 503d to package substrate 501. Because interposers 505 and 506 predominantly make vertical connections, predominantly vertical through vias are formed in interposers 505 and 506.

Figure 6:
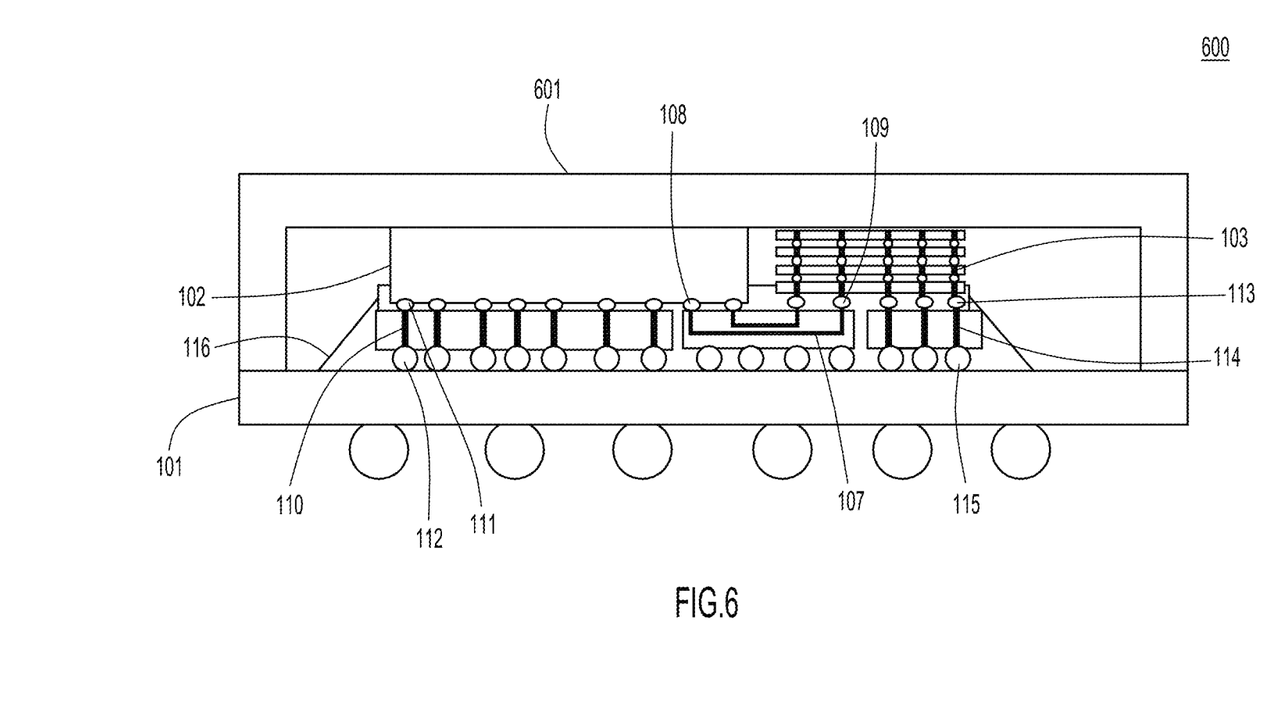
FIG. 6 is side view showing still another example MCM using multiple interposers and including a heat spreader or lid.

FIG. 6 depicts an MCM 600 which is similar to MCM 100 of FIGS. 1A and 1B, but includes a heat spreader or lid 601 placed in sealing contact with package substrate 101. Heat spreader or lid 601 helps dissipate heat from the MCM 600 while also protecting the components of the device. A similar heat spreader or lid could be applied to the MCMs depicted in the other figures described herein.

Figure 7:
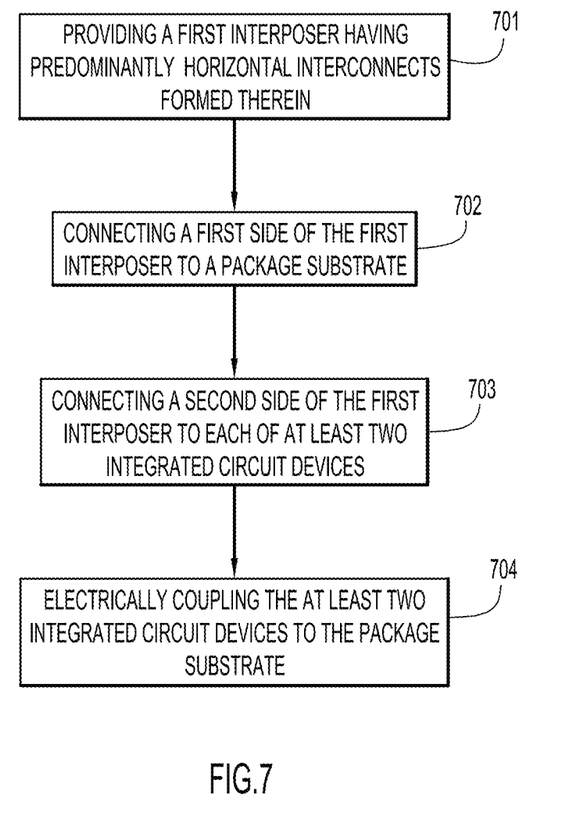
FIG. 7 is a flowchart illustrating a method of making an MCM using multiple interposers.

Turning now to FIG. 7, illustrated therein is a flow chart depicting an example method for making an MCM. In step 701, a first interposer is provided having predominantly horizontal interconnects formed therein. The interposer may also include microbumps already attached thereto.

In step 702, a first side of the interposer is attached to a package substrate. Attaching the package substrate may involve attaching the interposer to the package substrate through microbumps provided on the interposer. Alternatively, the interposer may be attached to the package substrate with regular solder bumps or adhesive.

In step 703, a second side of the interposer is attached to each of at least two integrated circuit devices. The integrated circuit devices may be attached to the interposer through microbumps provided on the interposer, or through microbumps provided on the integrated circuit devices. The interposer may be attached to at least two integrated circuit devices after the interposer has been attached to the package substrate, or alternatively, the interposer may be first attached to the at least two integrated circuit devices and later attached to the package substrate, as will be described in more detail with reference to FIGS. 8-11.

In step 704, the at least two integrated circuit devices are electrically connected to the package substrate. The electrical connections between the integrated circuit devices and the package substrate may be by vertical through vias in additional interposers, or alternatively, the electrically connections may be formed through other means, such as copper pillars.

Figure 8:
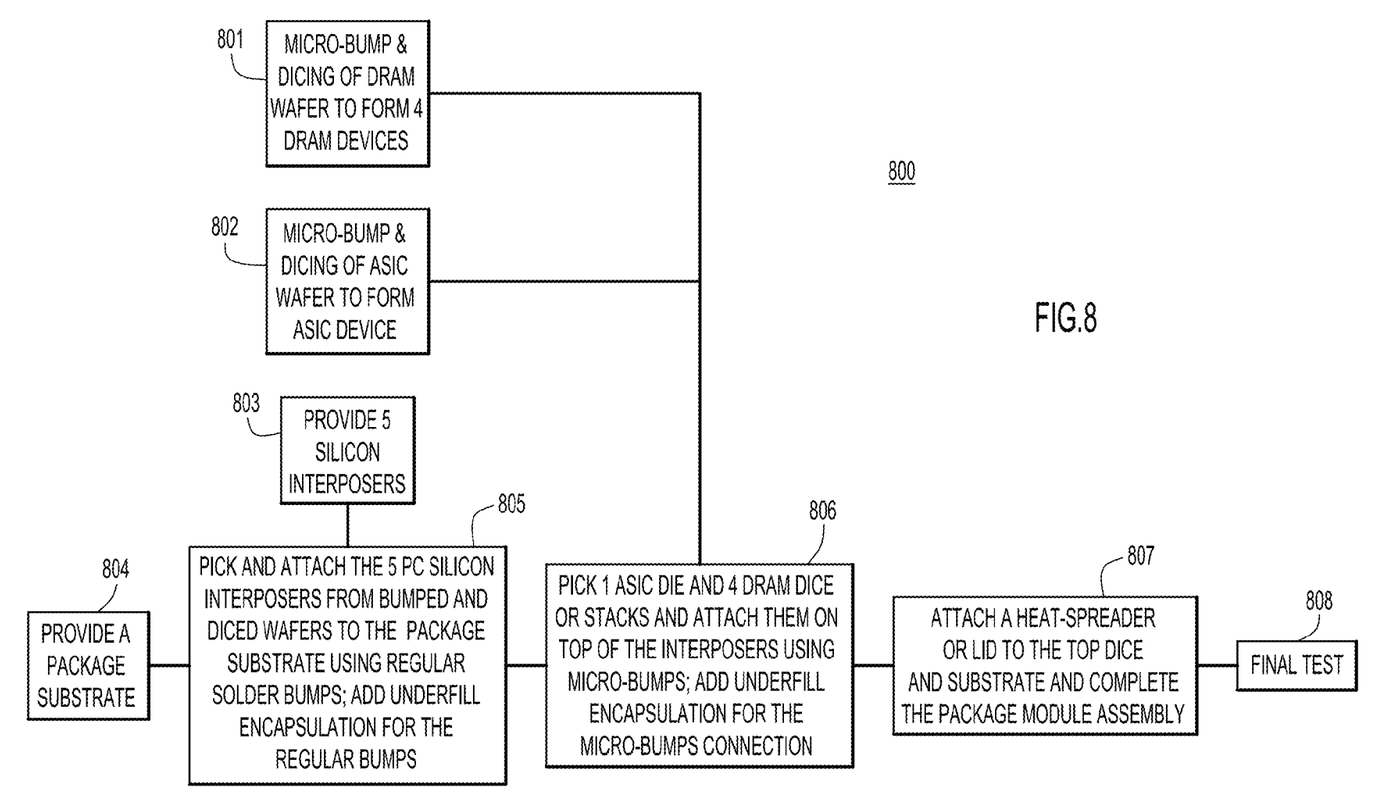
FIG. 8 is an illustration of a process for making an MCM using multiple interposers.

Reference is now made to FIG. 8, which depicts a process 800 of making an MCM similar to MCM 300 described above with reference to FIGS. 3A and 3B. In steps 801-804 the component parts of the MCM are provided. Specifically, at step 801a Dynamic Random Access Memory (DRAM) wafer is diced in order to form four DRAM integrated circuit devices. The DRAM devices may also comprise microbumps. In step 802, an ASIC wafer is diced to form an ASIC device, which may involve forming microbumps on the ASIC device. In step 803, five silicon interposers are provided, such that each silicon interposer has predominantly vertical or predominantly horizontal interconnects. In step 804, a package substrate is provided for mounting of the interposers and integrated circuit devices. Of course, steps 801-804 may take place in an order different from that described here, or some of the steps may take place simultaneously.

In step 805, the five silicon interposers are attached to the package substrate through the use of solder bumps. The interposers may be arranged such that when the DRAM and ASIC devices are attached, the interposers formed with horizontal interconnects may be arranged to form the electrical connections between the different integrated circuit devices, and the interposers with the vertical through vias may be arranged to form the electrical connections between the integrated circuit devices and the package substrate. Furthermore, the interposers may be arranged so that when the integrated circuit devices are attached, an area of overlap between one of the integrated circuit devices and one of the interposers is less than the entire area of the one integrated circuit device. Underfill encapsulation may be provided over the connections formed by the regular solder bumps.

In step 806, the ASIC and DRAM integrated circuit devices are attached to the interposers by the microbumps formed on either the integrated circuit devices or microbumps formed on the interposers. As described above, when the integrated circuited devices are attached to the interposers, the components are arranged so that the interposers formed with horizontal interconnects form the electrical connections between the different integrated circuit devices, and the interposers with the vertical through vias form the electrical connections between the integrated circuit devices and the package substrate. Furthermore, the components are arranged so that an area of overlap between one of the integrated circuit devices and one of the interposer is less than the entire area of the one integrated circuit device.

In step 807, a heat-spreader or lid is applied to the top of the package substrate, covering the integrated circuit devices and interposers.

Finally, in step 808, final tests are performed on the MCM.

Figure 9:
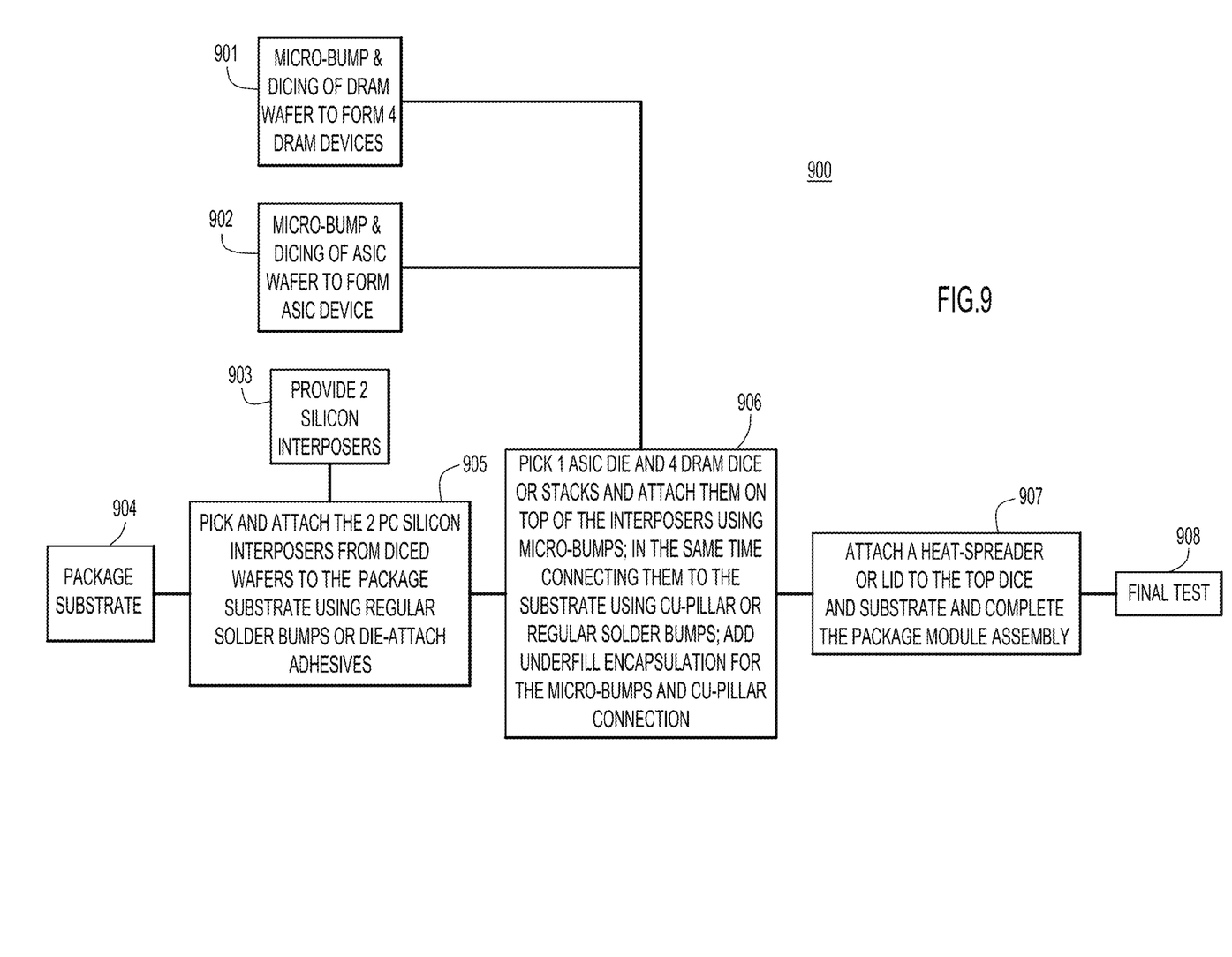
FIG. 9 is an illustration of a process for making an MCM using multiple interposers and copper pillars.

Turning now to FIG. 9, depicted therein is a process 900 of making an MCM similar to that described above with reference to FIGS. 4A and 4B. In steps 901-904 the component parts of the MCM are provided. Specifically, at step 901a DRAM wafer is diced in order to form four DRAM integrated circuit devices. The DRAM devices may have microbumps formed thereon. In step 902 an ASIC wafer is diced to form an ASIC integrated circuit device, including microbumps. In step 903 two silicon interposers are provided. The two silicon interposers will form the horizontal connections between the different integrated circuit devices, and therefore, predominantly horizontal interconnects are formed in the interposers. In step 904, a package substrate is provided for mounting of the interposers and integrated circuit devices. Of course, steps 901-904 may take place in an order different from that described here, or some of the steps may take place simultaneously.

In step 905, the two silicon interposers are attached to the package substrate through the use of regular solder bumps or die-attach adhesives. The interposers may be arranged such that when the DRAM and ASIC devices are attached, the interposers may be arranged to form the electrical connections between the different integrated circuit devices by the horizontal interconnects. Furthermore, the interposers may be arranged so that when the integrated circuit devices are attached, an area of overlap between one of the integrated circuit devices and one of the interposer is less than the entire area of the one integrated circuit device.

In step 906, the ASIC and DRAM integrated circuit devices are attached to the interposers through the microbumps formed on either the integrated circuit devices, or the interposers. As discussed above, when the integrated circuited devices are attached to the interposers, the components are arranged so that the interposers form the electrical connections between the integrated circuit devices. Furthermore, the electrical connections between the integrated circuit devices and package substrate are formed through copper pillars, or regular solder bumps. Underfill encapsulation may be provided over the connections formed by the copper pillars and/or regular solder bumps.

The assembly of the MCM is completed in step 907 when a heat spreader or lid is attached to the package substrate. In step 908, final tests are performed on the MCM.

Figure 10:
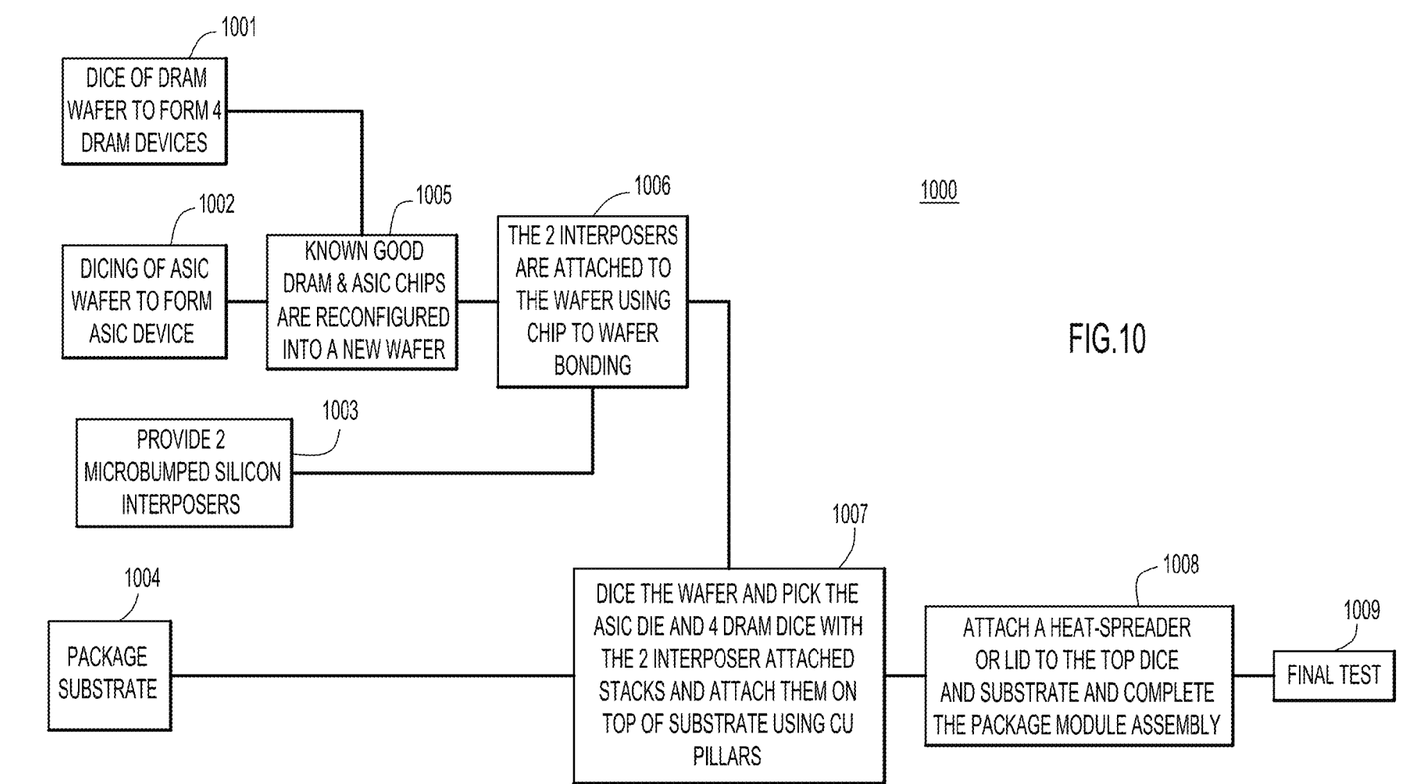
FIG. 10 is an illustration of another process for making an MCM using multiple interposers and copper pillars.

FIG. 10 depicts yet another process 1000 of making an MCM similar to the MCM described above in reference to FIGS. 4A and 4B. In steps 1001-1004 the component parts of the MCM are provided. Specifically, at step 1001 a DRAM wafer is diced in order to form four DRAM integrated circuit devices, which may include microbumps. In step 1002 an ASIC wafer is diced to form an ASIC integrated circuit device, including microbumps. In step 1003 two silicon interposers are provided. The two silicon interposers may support the horizontal connections between the different integrated circuit devices, and therefore, predominantly horizontal interconnects are formed in the interposers. In step 1004, a package substrate is provided for mounting of the interposers and integrated circuit devices. Of course, steps 1001-1004 may take place in an order different from that described here, or some of the steps may take place simultaneously.

In step 1005, the ASIC and DRAM devices are reconfigured into a new, combined wafer. In step 1006, the two interposers are attached to the new wafer using wafer bonding. In step 1007 the wafer comprising the interposers and integrated circuit devices is attached to the package substrate. The connections between the integrated circuit devices and the package substrate are formed using copper pillars. Finally, in step 1008 a heat spreader or lid is attached to the package substrate and in step 1009 final tests are performed on the MCM.

Figure 11:
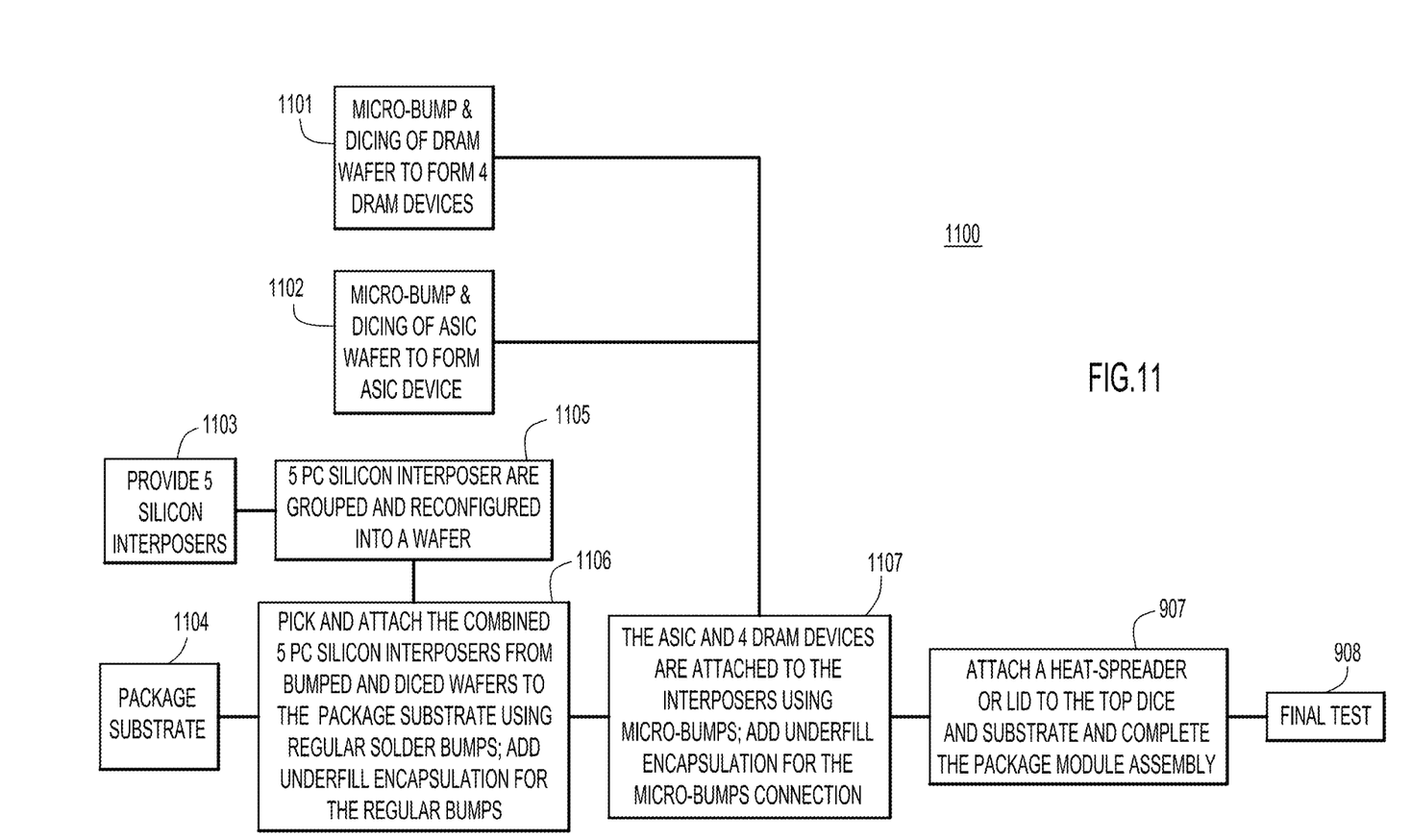
FIG. 11 is an illustration of another process for making an MCM using multiple interposers.

Turning to FIG. 11, depicted therein is yet another process 1100 of making an MCM similar to the MCM described above with reference to FIGS. 3A and 3B. In steps 1101-1104 the component parts of the MCM are provided. Specifically, at step 1101 a DRAM wafer is diced in order to form four DRAM integrated circuit devices, including microbumps. In step 802 an ASIC wafer is diced to form an ASIC integrated circuit device, including microbumps. In step 1103 five silicon interposers are provided. Step 1103 may involve providing each silicon interposer with predominantly vertical or predominantly horizontal interconnects. In step 1104, a package substrate is provided for mounting of the interposers and integrated circuit devices. Steps 1101-1104 may take place in an order different from that described here, or some of the steps may take place simultaneously.

In step 1105, five interposers are reconfigured into a new wafer. In step 1106, the interposer wafer is attached to the package substrate using regular solder bumps. Underfill encapsulation may be provided over the regular solder bump connections. In step 1107 the ASIC and four DRAM devices are attached to the interposers using microbumps. Underfill encapsulation may be provided over the microbump connections. Finally, in step 1108 a heat spreader or lid is attached to the package substrate, and in step 1109 final tests are performed on the MCM.

Figure 12:
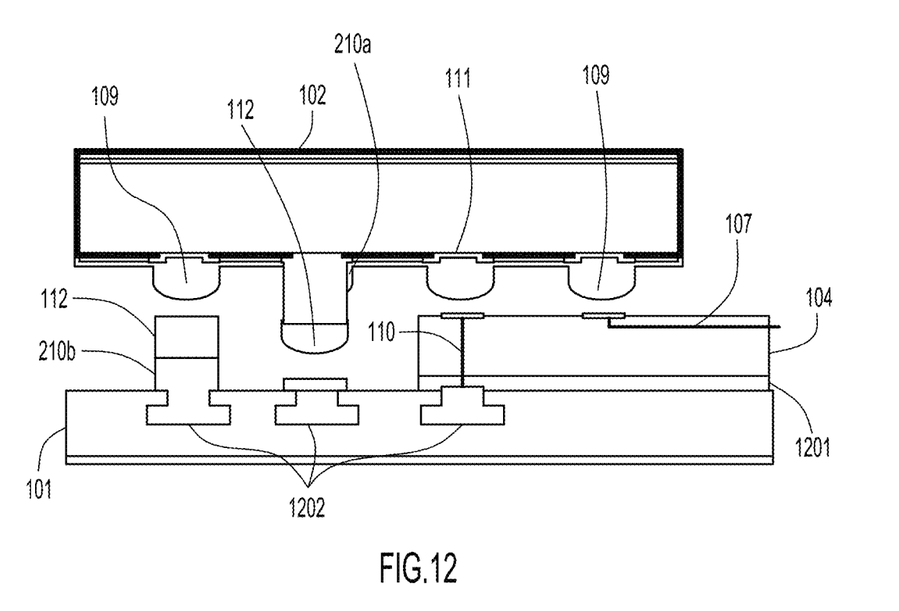
FIG. 12 is a side view illustrating types of electrical connections that may be used in example MCMs using the techniques described herein.

Reference is now made to FIG. 12. FIG. 12 illustrates various forms of connections that may be made between a package substrate 101, an ASIC 102, and interposer 104. Solder or adhesive 1201 may be used to attach interposer 104 to package substrate 101. The solder or adhesive 1201 may be approximately 25 um thick, or have some other appropriate thickness.

In order to make electrical connections between integrated circuit device 102 and another integrated circuit device, a horizontal interconnect 107 may be used. Accordingly, microbumps 109 are provided on integrated circuit device 102 to facilitate the connection to horizontal interconnect 107. Similarly, in order to make the electrical connections between ASIC 102 and vertical through via 110, microbumps 111 are provided on ASIC 102. Vertical through via 110 is, in turn, connected to connection pad 1202 on the package substrate 101.

Also illustrated in FIG. 12 are two types of copper pillar connections 210a and 210b. Copper pillar connection 210a comprises a copper pillar which is plated on top of diced ASIC 102. The copper pillar 210a is then connected to connection pad 1202 with tin solder 112. The height of the copper pillar 210a and solder 112 may be chosen to compensate for the height of interposer 104. For example, the copper pillar 210a may have a height of 45 um, while solder 112 may have a height of 5 um. Copper pillar connection 210b is formed by pre-soldering a copper pillar to the package substrate 101, and then connecting the copper pillar 210b to ASIC 102 through solder 112 and microbumps 109. The height of copper pillar 210b and solder 112 may also be chosen to compensate for the height of interposer 104.

Through the examples described above, numerous benefits can be achieved. For example, high wiring densities can be achieved for MCMs whose die size exceeds the largest available size for a single interposer. Furthermore, the use of multiple interposers allows for modular systems in which the smaller interposers can be tiled to accommodate different MCM designs.

Additionally, the smaller interposers can be manufactured with higher yield rates than larger interposers, lowering production costs for MCMs. Furthermore, because the smaller interposers may be manufactured with only a single type of electrical connection, for example vertical through vias or horizontal interconnects, the manufacturing yield for the interposers may be even further improved.

The above description is intended by way of example only.

What is claimed is:

1. An apparatus comprising:
a package substrate;
at least two integrated circuit devices, each of which is electrically coupled to the package substrate;
a first interposer comprising predominantly horizontal interconnects formed therein, the first interposer being arranged between the at least two integrated circuit device to electrically couple the at least two integrated circuit devices to each other,
a second interposer; and
a third interposer,
wherein for a first of the at least two integrated circuit devices, an area of overlap between the first of the at least two integrated circuit devices and the first interposer is less than an area of the first of the at least two integrated circuit devices, and
wherein the first of the at least two integrated circuit devices overlaps with the first interposer and the second interposer and does not overlap with the third interposer, and
wherein the second of the at least two integrated circuit devices overlaps with the first interposer and the third interposer and does not overlap with the second interposer.

2. The apparatus of claim 1, wherein the second interposer has vertical through vias formed therein, wherein the first of the at least two integrated circuit devices is electrically coupled to the package substrate by the vertical through vias in the second interposer.

3. The apparatus of claim 1, wherein the first of the at least two integrated circuit devices comprises an application specific integrated circuit, and the second of the at least two integrated circuit devices comprises a memory device.

4. The apparatus of claim 3, wherein the memory device comprises a memory stack.

5. The apparatus of claim 1, further comprising microbumps that electrically couple the at least two integrated circuit devices to the horizontal interconnects.

6. The apparatus of claim 5, further comprising underfill encapsulation of the microbumps.

7. The apparatus of claim 1, further comprising adhesive or solder bumps that electrically couple the first interposer to the package substrate.

8. The apparatus of claim 7, further comprising underfill encapsulation of the adhesive or solder bumps.

9. An apparatus comprising.
a package substrate;
at least two integrated circuit devices, each of which is electrically coupled to the package substrate; and
a plurality of interposers arranged to electrically couple the two integrated circuit devices to each other and to the package substrate, a first interposer of the plurality of interposers having predominantly vertical through vias and second and third interposers of the plurality of interposers having predominantly horizontal interconnects, wherein for a first of the at least two integrated circuit devices, an area of overlap between the first of the at least two integrated circuit devices and the first of the plurality of interposers is less than an area of the first of the at least two integrated circuit devices, wherein for a second of the at least two integrated circuit devices, an area of overlap between the second of the at least two integrated circuit devices and the first of the plurality of interposers is less than an area of the second of the second of the at least two integrated circuit devices;

wherein the first of the at least two integrated circuit devices overlaps with the first interposer and the second interposer, and does not overlap with the third interposer, and wherein the second of the at least two integrated circuit devices overlaps with the first interposer and the third interposer, and does not overlap with the second interposer, and wherein the first of the plurality of interposers is arranged between the at least two integrated circuit devices to electrically couple the at least two integrated circuit devices to each other.

10. The apparatus of claim 9, wherein for each of the at least two integrated circuit devices and each of the plurality of interposers, an area of overlap between each of the integrated circuit devices and each of the interposers is less than an area of each of the integrated circuit devices.

11. The apparatus of claim 9, wherein the first of the at least two integrated circuit devices comprises an application specific integrated circuit, and the second of the at least two integrated circuit devices comprises a memory stack.

12. The apparatus of claim 9, further comprising microbumps that electrically couple the at least two integrated circuit devices to the horizontal interconnects.

13. The apparatus of claim 1, wherein an area of the first interposer is less than an area of the first of the at least two integrated circuit devices and less than an area of a second of the at least two integrated circuit devices.

14. The apparatus of claim 1, wherein the first interposer further comprises vertical through vias.

15. The apparatus of claim 1, wherein the first interposer contains only horizontal interconnects.

16. The apparatus of claim 1, further comprising a heat spreader.

17. A Multi-Chip Module comprising the apparatus of claim 1.

18. The apparatus of claim 9, wherein an area of the first of the plurality of interposers is less than an area of the first of the at least two integrated circuit devices and less than an area of the second of the at least two integrated circuit devices.

19. The apparatus of claim 9, wherein the first of the plurality of interposers having predominantly horizontal interconnects further comprises vertical through vias.

20. The apparatus of claim 9, wherein the first of the plurality of interposers having predominantly horizontal interconnects contains only horizontal interconnects.

21. The apparatus of claim 9, further comprising a heat spreader.

22. The apparatus of claim 1, wherein the first interposer, the second interposer and the third interposer comprise a modular system of interposers forming all of the electrical interconnections between the at least two integrated circuit devices and all of the electrical connections between the at least two integrated circuit devices and the package substrate.

23. The apparatus of claim 22, wherein an area of at least one of the at least two integrated circuit devices is greater than an area of a largest of the modular system of interposers.

24. The apparatus of claim 9, wherein the plurality of interposers comprise a modular system of interposers forming all of the electrical interconnections between the at least two integrated circuit devices and all of the electrical connections between the at least two integrated circuit devices and the package substrate.

* * * * *